REMOTE CONTROL SWITCH RESPONSIVE TO SUPERIMPOSED POWER LINE FREQUENCY

Filed Sept. 8, 1965

INVENTOR
Dinaldo E. DeCola
BY Hofgren, Wegner, Allen, Stellman & McCord
ATTORNEYS United States Patent Office 3,467,835

Patented Sept. 16, 1969

3,467,835

REMOTE CONTROL SWITCH RESPONSIVE TO SUPERIMPOSED POWER LINE FREQUENCY

Rinaldo E. De Cola, Park Ridge, Ill., assignor to Warwick Electronics Inc., a corporation of Delaware Filed Sept. 8, 1965, Ser. No. 485,820
Int. Cl. H01h *47/22, 83/16;* H02b *1/24*
U.S. Cl. 307—125 7 Claims

ABSTRACT OF THE DISCLOSURE

An electronic remote control switch using the power lines to connect a transmitter to a receiver. The signal from the transmitter, an odd harmonic of the television line frequency, is detected in the receiver to control the switch. The receiver has a series tuned circuit connected across the power line and a parallel tuned circuit connected with a relay control transistor. A diode across the inductor of the series circuit suppresses transients to prevent damage to the transistor.

Figure 1:
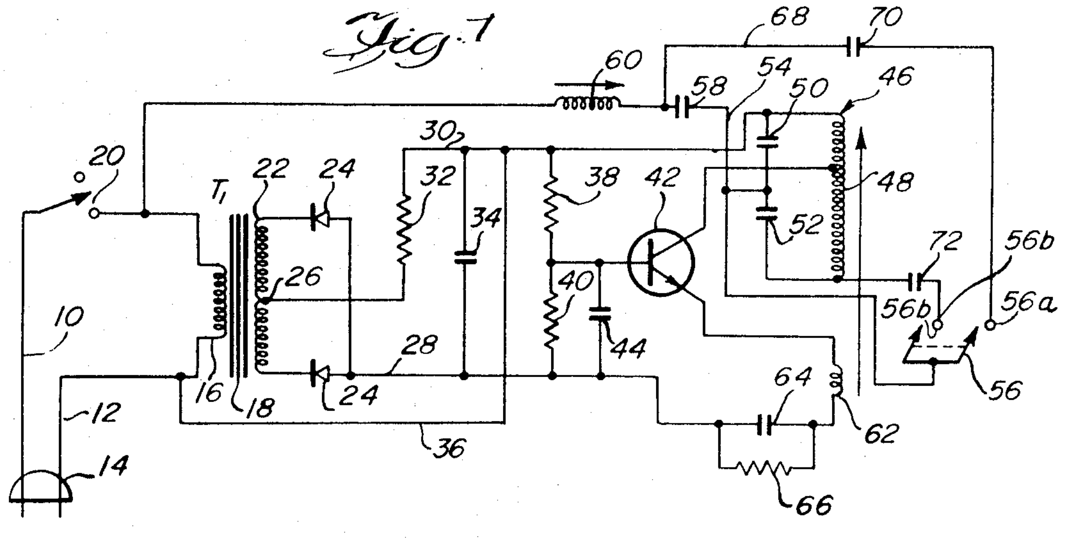

This invention relates to an electronic switching device that may be connected to a power line and is responsive to remotely generated signals carried by the power line for energizing an electrical load as an appliance, a light or the like.

The use of switching devices connected to power transmission lines and responsive to remotely generated signals placed on the line and carried thereby for actuating electrical devices is well known. Many such devices are electro-mechanical in nature and rely on tuned mechanical devices for detection of the remotely generated signal. Such devices, while effective for their intended purpose, have generally proved unsatisfactory due to their bulkiness and high cost, such undesirable characteristics being inherently present in the devices because of the size of the mechanical elements and the costly machining operations required to assure that the mechanical elements are properly within a narrow range of tolerances.

To overcome these problems, the prior art has resorted to use of such switching devices which are comprised almost entirely of electronic elements. However, many of the known electronic switching devices are relatively complex and thereby prohibitively expensive for common use, as for example, in a home. Furthermore, with the increased use of electric power, transient signals, as for example, those generated in the operation of motors and, to some extent, in television receivers and the like, are fed into the transmission lines and cause the electronic switching devices to be inadvertently actuated. Obviously, such random actuations of the electronic switching devices are undesirable.

It is therefore, the primary object of the invention to provide a new and improved electronic switching device.

More specifically, it is an object of the invention to provide a simply constructed and economical electronic switching device.

Another object of the invention is the provision of such an electronic switching device wherein means are provided for precluding actuation of switch means in response to transient signals on the power line.

A further object of the invention is the provision of such an electronic switching device including means for precluding the passage of a remotely generated switching signal to a load adapted to be energized by the switching device.

Still another object of the invention is the provision of such an electronic switching device that is selectively responsive to a plurality of remotely generated signals carried by a transmission line.

Yet another object of the invention is the provision of such an electronic switching device including a series resonant circuit having a resonant frequency substantially equal to the frequency of the remotely generated signal, a parallel resonant circuit connected to the series resonant circuit and having the same resonant frequency, a detector and amplifier arrangement that is responsible to the presence of a high voltage across the parallel resonant circuit, which high voltage is indicative of the presence of a remotely generated signal, and switch means responsive to the conduction of the amplifier and detector for delivering electrical energy from the transmission line to an electrical appliance.

A still further object of the invention is the provision of such electronic switching device wherein a diode is connected to the series resonant circuit for clipping transient signals appearing on the transmission line to preclude response of the switch means thereto.

Figure 2:
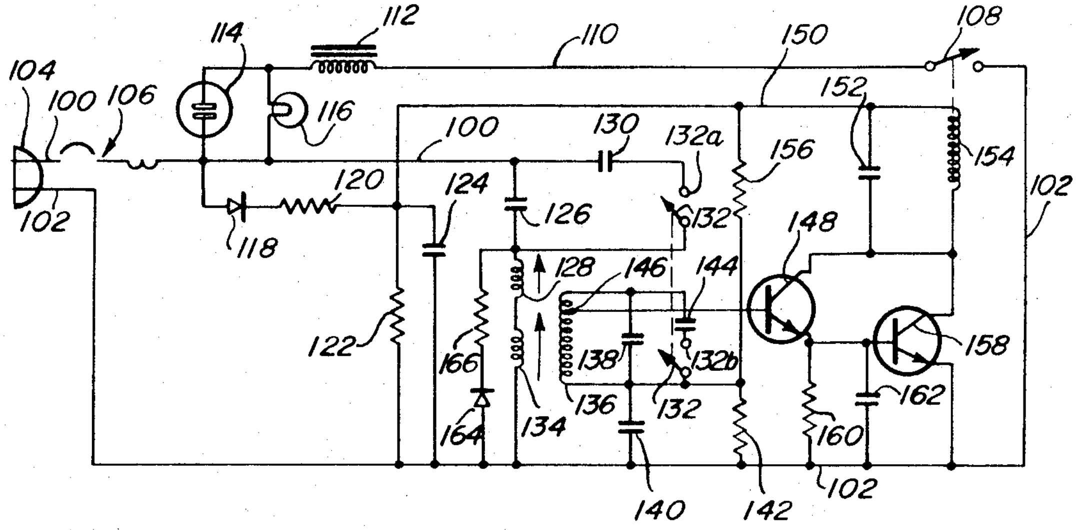

Other objects and advantages of the invention will be apparent from the following description taken in connection with the accompanying drawings in which:

FIGURE 1 is a schematic diagram of the circuit of a transmitter which may be connected to a transmission line for generating control signals; and FIGURE 2 is a schematic diagram of an electronic switching device made in accordance with the invention and responsive to remotely generated signals carried by a power line, such as those generated by the generator of FIGURE 1.

While this invention is susceptible of embodiments in many different forms, there is shown in the drawings and will herein be described in detail an embodiment of the invention with the understanding that the present disclosure is to be considered as an exemplification of the principles of the invention and is not intended to limit the invention to the embodiment illustrated. The scope of the invention will be pointed out in the appended claims.

One form of signal generating device that may be used in conjunction with the electronic switch means of the present invention is shown in FIGURE 1. A pair of leads 10 and 12 are adapted to be connected to a power transmission line, not shown, by any suitable means such as a plug 14 which may be received in a receptacle or socket, not shown. The leads 10 and 12 are connected to the primary coil 16 of a power transformer 18 through a two-position "off-on" switch 20. The transformer 18 includes a secondary coil 22 having its ends associated with a pair of diodes 24 and a center tap 26 forming a full wave rectifier which serves as the power supply for the signal generating device. The diodes 24 have a common connection to a line 28, while the center tap 26 is connected to a line 30. A resistor 32, which may have a value of 47 ohms, is placed in the line 30, while a filter capacitor 34 having a value of 50 microfarads is placed across the lines 28 and 30. The resistor 32 and the capacitor 34 serve as a filter for the output of the full wave rectifier. Additionally, the line 30 is connected to the lead 12 by a lead 36.

Interposed between the lines 28 and 30 are a pair of resistors 38 and 40 and which may have values of 18,000 and 2200 ohms, respectively. The resistors 38 and 40 serve as a voltage divider and have their common junction connected to the base of a transistor 42. A capacitor 44, which may have a value of .01 microfarad, is connected to the base of the transistor 42 and to the line 28.

The transistor 42 serves as an oscillator which is energized by the closing of the switch 20 to generate a signal at a predetermined frequency, which signal is placed on the leads 10 and 12 and thus, on the transmission line to which they are connected. In order to achieve this function, the collector circuit of the transistor 42 includes a tank circuit 46 having a variable inductance 48 and a pair of capacitors 50 and 52 having values of .08 microfarad and 470 picofarads, respectively. Connected to the common junction of the capacitors 50 and 52 is a line 54 having one end thereof connected to both poles of a double pole single throw switch 56. The other end of the line 54 includes a capacitor 58, having a value of 2200 picofarads, which, in turn, is connected to a variable inductance 60 to form a circuit which is series resonant at the frequency of oscillation of the transistor 42. The variable inductor 60 is in turn connected to the lead 10 at the junction of the switch 20 and the primary coil 16 of the transformer 18. As will be apparent, the series resonant circuit comprised of the capacitor 58 and the inductor 60 serves to preclude the presence at the transistor 42 of an alternating current signal having a frequency that varies appreciably from the oscillator frequency such as the 60 cycle frequency used on most transmission lines while permitting the output signal from the oscillator 42 to pass and be conducted through the leads 10 and 12 to the transmission line.

The emitter circuit of the transistor 42 includes a feedback coil 62 which may conveniently form a part of the inductor 48. The feedback coil 62 is connected to a parallel circuit comprised of a capacitor 64 and a resistor 66 having values of .05 microfarad and 120 ohms, respectively. The capacitor 64 and the resistor 66 additionally have a common junction with the line 28.

In order to provide a selection of signal frequencies, there is provided a line 68 which is connected to the common junction of the inductor 60 and the capacitor 58 and includes a capacitor 70, which may have a value of 1500 picofarads, which in turn, is connected to a contact **56*a* of the switch 56. There is also provided a capacitor 72 having a value of 430 picofarads which is connected to the common junction of the inductor 48 and the capacitor 52 of the tank circuit 46 and a contact 56*b* of the switch 56. The switch 56, when closed, is arranged to provide a common junction between the line 54, the capacitor 70 and the capacitor 72. Thus, upon such an occurrence the capacitors 70 and 72 are introduced into the circuit whereby the capacitor 70 serves to change the resonant frequency of the series resonant circuit comprised of the inductor 60 and the capacitor 58 while the capacitor 72 serves to change the capacitance of the tank circuit 46 to change the frequency of oscillation of the transistor 42.** In this manner, the signal generator may be used to selectively generate signals on any one of a plurality of channels.

Turning now to FIGURE 2, there is seen an exemplary form of an electronic switching device made in accordance with the invention. There are provided a pair of leads 100 and 102 which are adapted to be connected to a power or transmission line in any conventional manner as for example, by the insertion of a plug 104 into a socket. The line 100 is optionally provided with a circuit breaker 106 which may be omitted if the switching device is to be employed with a low current load. The lead 102 is provided with a relay operated switch 108 which is actuated in a manner to be described hereinafter. Connected to the switch 108 is a line 110 which may be provided with a radio frequency choke 112 which is operative to preclude the passage to a load connected to an outlet 114 of signals in the frequency range of those generated by the signal generating device of FIGURE 1. The radio frequency choke 112 may be omitted, however, if the electronic switching device is to be used in conjunction with a high impedance load that does not short out the radio frequency signals. The choke 112 is connected to one pole of an outlet 114 which, in turn, has its other pole connected to the line 100. A plug, not shown, from any load as an appliance may be received in the outlet 114 and, as is apparent, will be energized when the switch 108 is closed. A lamp 116 is similarly interposed between the lines 110 and 100 and will be similarly energized by the closing of the switch 108. Of course, it will be apparent, that virtually any electrical load that one may desire to energize by generation of a signal at a remote point as by means of the signal generating device shown in FIGURE 1, may be placed between the lines 110 and 100 in lieu of either or both the socket 114 and the lamp 116.

A diode 118, is connected to the line 106 and is in series with a resistor 120, which may have a value of 3300 ohms, and a parallel circuit comprised of a resistor 122 and a capacitor 124, which may have values of 2200 ohms and 150 microfarads respectively, across the line 102. This construction serves as a half wave rectifier power supply for the electronic switching device.

A capacitor 126, which may have a value of 2200 picofarads, is connected in series with a variable inductor 128 to form a series resonant circuit having its resonant frequency approximately equal to the first frequency of the signal generated by the generator shown in FIG. 1. A second capacitor 130 having a value of 1500 picofarads is adapted to be connected in parallel with the capacitor 126 by means of one contact **132*a* of a double pole single throw switch 132. By closing the switch 132, the resonant frequency of the series resonant circuit may be selectively changed to accommodate an input signal having a frequency equal to the second frequency generated by the transmitter shown in FIG. 1. A non-linear diode 164 is connected in series with a 100 ohm resistor 166 between the line 102 and the common junction of the capacitor 126 and the inductor 128.**

The variable inductor 128 is connected through a variable inductance 134 to the line 102. Associated with the inductance 134 is a coil 136 in which is induced the signal passing through the series resonant circuit and the inductor 134. A capacitor 138 is connected across the ends of the coil 136 and in turn to the line 102 through a parallel circuit comprised of a capacitor 140 and a resistor 142. The capacitor 138 may have a value of 470 picofarads. Preferably the capacitor 140 may have a value of .01 microfarad, while the resistor 142 has a value of 4700 ohms to provide a relatively large value time constant in the circuit for purposes to be seen hereinafter. Connected in parallel with the capacitor 138 across the ends of the coil 136 is the series circuit comprised of a capacitor 144 which have a value of 330 picofarads, and a second contact **132*b* of the switch 132. The inductor 136 and the capacitor 138 form a parallel resonant circuit having its resonant frequency approximately equal to that of the remotely generated input signal. The resonant frequency of this parallel resonant circuit may be altered to accommodate an input signal having a different frequency by closing the switch 132 to cause the capacitor 144 to be placed in parallel with the capacitor 138.**

A tap 146 in the inductor 136 is connected to the base of a transistor 148 of a detector and amplifier circuit. The collector of the transistor 148 is connected to a line 150 through a parallel circuit comprised of a capacitor 152, which should have a relatively large value such as 25 microfarads, and the relay coil 154 for the switch 108, the capacitor 152 serving to bypass noise pulses to prevent improper energization of the relay 154 thereby. Line 150, is in turn, connected to the common junction of the resistors 120 and 122 and the capacitor 124. Additionally, a 82,000 ohm resistor 156 is interposed between the line 150 and the common junction of the capacitors 138 and 140, the inductor 136 and the resistor 142. The emitter of the transistor 148 is connected to the base of a transistor 158 and to the line 102 by a parallel circuit comprised of a resistor 160 and a capacitor 162 having values of 10,000 ohms and 500 microfarads respectively. The transistor 158 has its collector connected to the common junction of the relay coil 154, the capacitor 152 and the collector of the transistor 148. The emitter of the transistor 158 is connected directly to the line 102.

The operation of the switch is as follows. The closing of the switch 20 of a signal generator such as that shown in FIGURE 1 causes a signal having a predetermined frequency to be introduced onto a transmission line and carried thereby. This function is achieved by operation of the oscillator 42 at a frequency controlled by its tank circuit 46. The resultant signal is fed to the transmission line through the series resonant circuit comprised of the capacitor 58 and the inductor 60 (and the capacitor 70 if the switch 56 is closed). Power at the regular frequency carried by the transmission line is supplied to the leads 100 and 102 and cause operation of the half wave rectifier power supply formed by the diode 118, the resistances 120 and 122 and the capacitor 124 to provide operating potentials for the transistors 148 and 158. The series resonant circuit comprised of the capacitor 126 and the inductor 128 (and the capacitor 130 if the switch 132 is closed) permits passage of signals having a frequency approximately equal to its resonant frequency which, as noted above, is preselected to approximate the frequency at which the signal generator operates while effectively precluding the passage of signals at other frequencies and in particular, the frequency of the power on the transmission line. Upon the passage of a signal through the series resonant circuit to the inductor 134, a signal is induced on the inductor 136 of the parallel resonant circuit. Because of the high impedance presented by the parallel resonant circuit at its resonant frequency, the received signal is applied to the base of the transistor 148, which rectifies the radio frequency signal. An amplified D.C. signal appears across resistor 160, and is applied to the base of the transistor 158 to cause the latter to conduct heavily. When the transistor 158 begins to conduct, power flows from the line 100 to the diode 118, the resistor 120, the line 150 and the relay coil 154 of the switch 108 through the transistor 158 to the line 102. This current flow causes the switch 108 to close and to supply electrical power to the outlet 114 and the lamp 116. In this manner, the closing of the switch 20 of the signal generating device at a remote point will cause energization of an electrical applianace such as the lamp 116 or another electrical appliance connected to the outlet 114.

In order to prevent energization of the relay coil 154 to close the switch 108 in response to the presence of a transient signal across the leads 100 and 102, such transient signals are clipped by the non-linear diode 164. As a further preventative measure, the large value time constant of the capacitor 140 and the resistor 142 preclude short duration transients from reaching the base of the transistor 148.

Since the diode 164 is non-linear, it, to some extent, acts as a mixer when two or more signals are impressed across it. To preclude intermodulation of the signals due to the mixing effect of the diode 164, the resistor 166 is placed in series therewith to minimize such action while permitting the clipping action of the diode 164 to occur.

When it is desired to turn off the appliance which has been actuated by the remotely generated signal, the remotely generated signal present on the transmission line is removed therefrom as by the opening of the switch 20. Upon this occurrence, the series resonant circuit comprised of the capacitor 126 and the inductor 128 effectively precludes the passage of any signal of constant duration while the non-linear diode 164 serves to clip any transient signals present on the line to preclude the presence of any signal of significant amplitude in the parallel resonant circuit comprised of the inductors 134 and 136 and the capacitor 138. Accordingly, an essentially zero voltage is applied to the base of the transistor 148 to cause the latter to be cut off and placed in a nonconducting state. As a result of the transistor 148 reaching cut-off, the transistor 158 is also cut-off and current will no longer flow through the relay coil 154 thereby permitting switch 108 to open and terminate operation of the appliance connected to the outlet 114 or the lamp 116.

When the frequency determining circuit elements have the specific values disclosed, the transmitter will generate as signal at frequencies of about 197 kc. and 151 kc. when the switch 56 is opened or closed respectively. The electronic switch will be actuated by signals at these frequencies respectively when the switch 132 is open or closed. Such frequencies have been chosen for operation as they are odd harmonics of one-half the horizontal line frequency of television receivers and thereby provide the electronic switch with additional immunity from transients and harmonics thereof generated by television receivers.

Through the use of the principles of the invention, a simple, inexpensive, compact signal generating device of a portable nature may be used to remotely control the operation of electrical appliances. Furthermore, the invention provides a plurality of signal channels whereby a plurality of electronic switching devices may be used on a single transmission line without interference with each other. Finally, an electronic switching device made according to the invention is not subject to inadvertent actuation due to the generation of transient signals by electrical appliances connected to the transmission line.

I claim:

1. In a switching device for connection to a transmission line and responsive to a remotely generated signal of a predetermined frequency on said line for energizing a load connected to said line, the combination comprising: first means adapted to be connected to said line for receiving said signal therefrom and for transmitting power to said appliance; a series resonant circuit having an inductor element and a capacitor element connected in series across said first means and having a resonant frequency substantially equal to said predetermined frequency whereby substantially only signals of said predetermined frequency will be passed thereby; a parallel resonant circuit connected across only one element of said series resonant circuit and having a resonant frequency substantially equal to said predetermined frequency whereby the passing of signals by said series resonant circuit will cause a relatively high voltage to be present across said parallel resonant circuit; normally non-conductive amplifier means connected to said parallel resonant circuit and operative to become conducting upon the presence of said high voltage; and switch means responsive to the conduction of said amplifier means for delivering electrical energy from said first means to said load to energize the latter.

2. The switching device of claim 1 further including means connected across said one element of the series resonant circuit for clipping transient signals on said line to preclude response of said switch means thereto.

3. In a switching device for connection to a transmission line and responsive to a remotely generated signal of a predetermined frequency on said line for energizing a load connected to said line, the combination comprising: first means adapted to be connected to said line for receiving said signal therefrom and for transmitting power to said appliance; a series resonant circuit connected to said first means and having a resonant frequency substantially equal to said predetermined frequency whereby substantially only signals of said predetermined frequency will be passed thereby; a parallel resonant circuit connected to said series resonant circuit and having a resonant frequency substantially equal to said predetermined frequency whereby the passing of signals by said series resonant circuit will cause a relatively high voltage to be present across said parallel resonant circuit; normally non-conductive amplifier means connected to said parallel resonant circuit and operative to become conductive upon the presence of said high voltage; switch means responsive to the conduction of said amplifier means for delivering electrical energy from said first means to said load to energize the latter; means for clipping transient signals on said line to preclude response of said switch means thereto; and means for effectively precluding intermodulation of signals on said line.

4. The switching device of claim 1 further including a diode connected across said one element of the series resonant circuit.

5. The invention of claim 1 further including a diode and a resistor connected serially across said one element of the series resonant circuit.

6. The switching device of claim 1 wherein the frequency of said signal is an odd harmonic of one-half the horizontal line frequency of a television receiver and said signal receiving means is arranged to receive the signal at said frequency.

7. A switching device adapted to be connected to a power line and to be actuated by a remotely generated signal of a predetermined frequency on said power line, said switching device comprising: switch means; means adapted to be connected to said power line for receiving said signal of predetermined frequency and for actuating said switch means in response thereto; a diode connected to said receiving and actuating means precluding actuation of the switch in response to transient signals; and a resistor in series with said diode precluding intermodulation of signals in said switchng device.

References Cited

UNITED STATES PATENTS

| | | | |
|---|---|---|---|
| 2,928,012 | 3/1960 | Hurst | 307—105 |
| 3,087,440 | 4/1963 | Zarnstorff | 307—129 X |
| 3,119,047 | 1/1964 | Michalski | 317—147 X |
| 3,133,251 | 5/1964 | Hays et al. | 325—383 X |
| 3,277,307 | 10/1966 | Smeton et al. | 307—73 X |
| 3,287,722 | 11/1966 | Craig. | |
| 3,308,311 | 3/1967 | Swanson | 307—93 |
| 3,334,185 | 8/1967 | Marlot | 307—93 X |
| 3,337,777 | 8/1967 | Schwanenflugel | 317—147 |

ROBERT K. SCHAEFER, Primary Examiner

T. B. JOIKE, Assistant Examiner

U.S. Cl. X.R.

307—140; 317—147; 340—171, 310